US008941288B2

(12) United States Patent
Okabayashi

(10) Patent No.: US 8,941,288 B2
(45) Date of Patent: Jan. 27, 2015

(54) POWER GENERATING APPARATUS AND POWER GENERATING METHOD

(75) Inventor: Hiroki Okabayashi, Yokohama (JP)

(73) Assignee: Pioneer Corporation, Kanagawa (JP)

( * ) Notice: Subject to any disclaimer, the term of this patent is extended or adjusted under 35 U.S.C. 154(b) by 360 days.

(21) Appl. No.: 13/522,634

(22) PCT Filed: Jan. 21, 2010

(86) PCT No.: PCT/JP2010/050688
§ 371 (c)(1),
(2), (4) Date: Jul. 17, 2012

(87) PCT Pub. No.: WO2011/089699
PCT Pub. Date: Jul. 28, 2011

(65) Prior Publication Data
US 2012/0299443 A1    Nov. 29, 2012

(51) Int. Cl.
*H02N 2/18*        (2006.01)
*H01L 41/113*     (2006.01)
*H01L 41/083*     (2006.01)

(52) U.S. Cl.
CPC ............. *H02N 2/18* (2013.01); *H01L 41/083* (2013.01); *H01L 41/113* (2013.01)
USPC .......................................... 310/339; 310/369

(58) Field of Classification Search
CPC ...................................................... H02N 2/18
USPC .......................................................... 310/339
See application file for complete search history.

(56) References Cited

U.S. PATENT DOCUMENTS 7,511,404 B2 *   3/2009   Lee .................................. 310/339
8,247,952 B2 *   8/2012   Chang ........................... 310/339
(Continued)

FOREIGN PATENT DOCUMENTS

| | | |
|---|---|---|
| JP | 63-190751 | 12/1988 |
| JP | 64-5466 | 1/1989 |
| JP | 11-330582 | 11/1999 |

(Continued)

OTHER PUBLICATIONS

International Search Report, PCT/JP2010/050688, Feb. 16, 2010.

*Primary Examiner* — J. San Martin
(74) *Attorney, Agent, or Firm* — Young & Thompson

(57) ABSTRACT

When a rotating shaft member (140) rotates, a centrifugal force operates to a pressing member (152$_{jk}$) (j=1 to J; k=1 to 6) which is fixed to the rotating shaft member (140). When the centrifugal force operates to the pressing member (152$_{jk}$), the end portion of the second bar-like member (157), which is connected to a first bar-like member (156) on the other end portion, moves closer to a pressure transmitting member (130), and a contact member (158) connected to said end portion of the second bar-like member (157) presses the pressure transmitting member (130). When the pressure transmitting member (130) is pressed in this manner, the pressing force is applied to a piezoelectric element of an individual power generating section (122$_{jp}$) which abuts on the R direction side of the pressing position of the pressure transmitting member (130). When the pressing force is applied to the piezoelectric element in this manner, the piezoelectric element continuously generates voltages. As a result, power can be generated at a high efficiency, while using the piezoelectric element.

8 Claims, 7 Drawing Sheets

(56) References Cited

U.S. PATENT DOCUMENTS 8,450,909 B2 * 5/2013 Lee et al. .................. 310/339
2012/0007473 A1 * 1/2012 Oh ............................ 310/339

FOREIGN PATENT DOCUMENTS

| JP | 2002-262584 | 9/2002 |
| JP | 2008-240470 | 10/2008 |

* cited by examiner

POWER GENERATING APPARATUS AND POWER GENERATING METHOD

TECHNICAL FIELD

The present invention relates to a power generation device and to a power generation method.

BACKGROUND ART

In recent years, in order to maintain and improve the global environment, the development of power generation devices that impose as little environmental load as possible has progressed remarkably. One such power generation device is a device that generates power by continually and repeatedly changing the pressure applied to a piezoelectric element.

As one such power generation device that employs a piezoelectric element, a power generation device has been proposed including a piezoelectric block that consists of a plurality of piezoelectric elements, a rotating member, support members each of which is attached to the rotating member in the state of being biased by a spring in the outward direction, and rollers that are freely rotatably supported at the ends of these support members (refer to Patent Document #1, hereinafter termed the "prior art example"). With this power generation device of the prior art example, on the basis of the rotation of the rotating member, the rollers sequentially ride over the piezoelectric block, and the piezoelectric block is pressurized due to the biasing forces generated by the springs. Due to this periodic pressurization, voltages that change periodically are repeatedly and periodically generated by the piezoelectric block.

PRIOR ART DOCUMENTS

Patent Documents

Patent Document #1: Japanese Laid-Open Patent Publication 1999-330582.

SUMMARY OF THE INVENTION

Problems to be Solved by the Invention

With the above described prior art technology it is arranged, along with rotating the rotating member that includes the springs, the support members, and the rollers in order to ensure the periodicity of pressurization of the piezoelectric block, also to employ the springs for generating pressure forces against the piezoelectric block. In other words, with the technology of the prior art example, it is arranged to provide a mechanism for ensuring the periodicity of pressurization of the piezoelectric block, and a mechanism for generating pressure forces against the piezoelectric block, independently from one another. As a result, it has been difficult to provide an extremely simple construction.

Due to this, a technology is eagerly awaited for implementation of a power generation device that employs a piezoelectric element and has a construction simplified over the technology of the prior art example. To respond to this requirement is considered as being one problem that the present invention must solve.

The present invention has been conceived in consideration of the circumstances described above, and it takes as its object to provide a novel power generation device and a novel power generation method, that can implement power generation at high efficiency using a piezoelectric element.

Means for Solving the Problems

Considered from a first standpoint, the present invention is a power generation device, comprising: a plurality of piezoelectric elements that are arranged upon the inner wall surface of a cylindrical outer frame member; a rotating shaft member that rotates around the central axis of said outer frame member as a central rotational axis; a pressure transmission member provided over said plurality of piezoelectric elements and shaped as a cylinder having a central axis that is parallel to the central axis of said outer frame member; and a pressure member whose one end portion is fixed to said rotating shaft member and whose other end portion, along with shifting over said pressure transmission member along with the rotation of said rotating shaft member, also presses upon said pressure transmission member due to centrifugal force originating in said rotation.

And, considered from a second standpoint, the present invention is a power generation method employed by a power generation device that comprises a plurality of piezoelectric elements that are arranged upon the inner wall surface of a cylindrical outer frame member; a rotating shaft member that rotates around the central axis of said outer frame member as a rotational axis; a pressure transmission member provided over said plurality of piezoelectric elements and shaped as a cylinder having a central axis that is parallel to the central axis of said outer frame member; and a pressure member whose one end portion is fixed to said rotating shaft member and whose other end portion, along with shifting over said pressure transmission member along with the rotation of said rotating shaft member, also presses upon said pressure transmission member due to centrifugal force originating in said rotation, comprising: a rotation process of rotating said rotating shaft member; and a pressing process of, while due to the rotation of said rotating shaft member said other end portion of said pressure member is shifted over said pressure transmission member along its circumferential direction, employing centrifugal force generated due to said rotation to press upon said pressure transmission member with said other end portion of said pressure member.

EMBODIMENTS FOR CARRYING OUT THE INVENTION

In the following, an embodiment of the present invention will be explained with reference to FIGS. 1 through 7. It should be understood that, in the following explanation and drawings, the same reference symbols are appended to elements that are the same or equivalent, and duplicated explanation is omitted.

[Structure]

Figure 1:
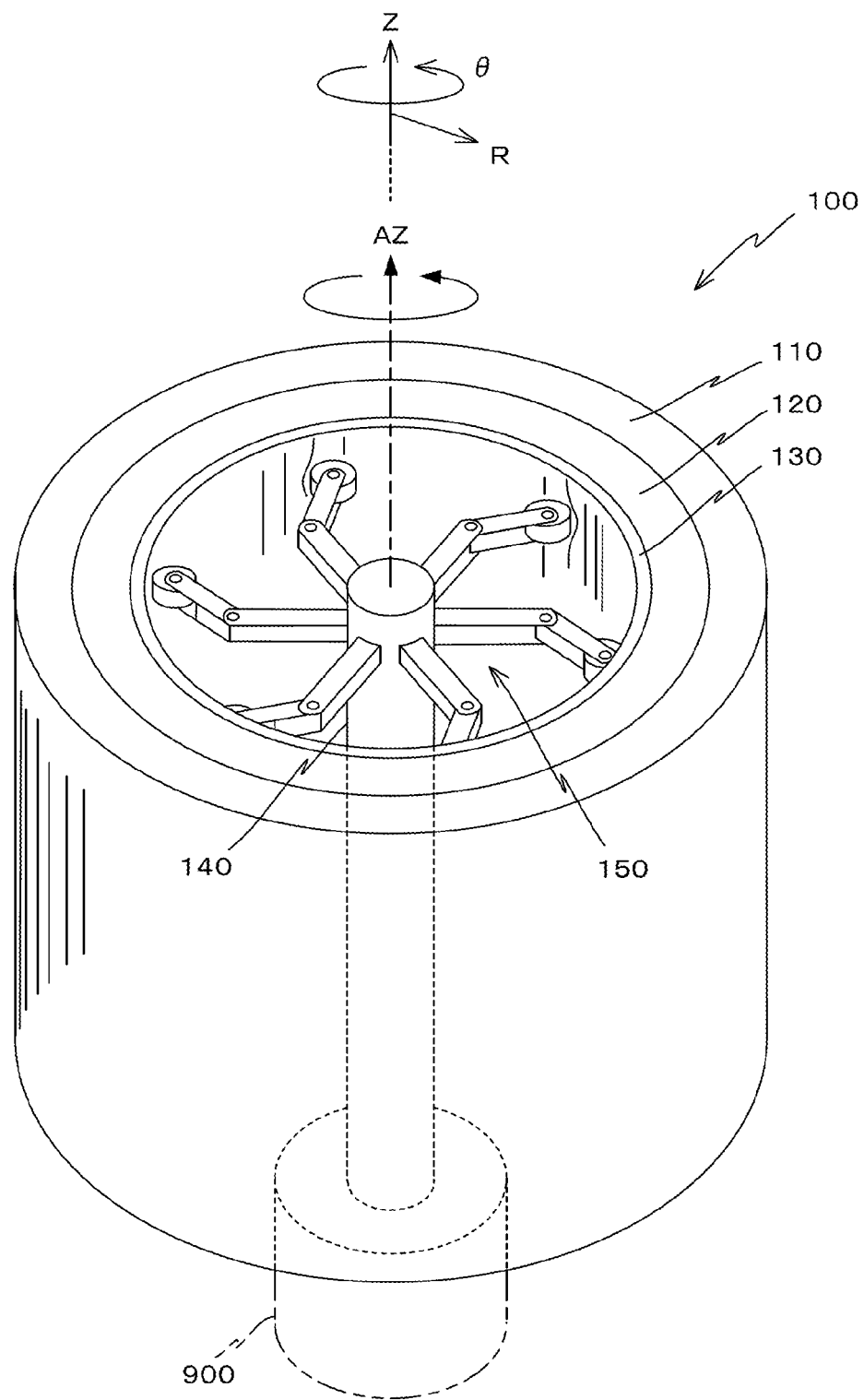
FIG. 1 is a figure showing the external appearance of a power generation device that is an embodiment of the present invention.
Figure 2:
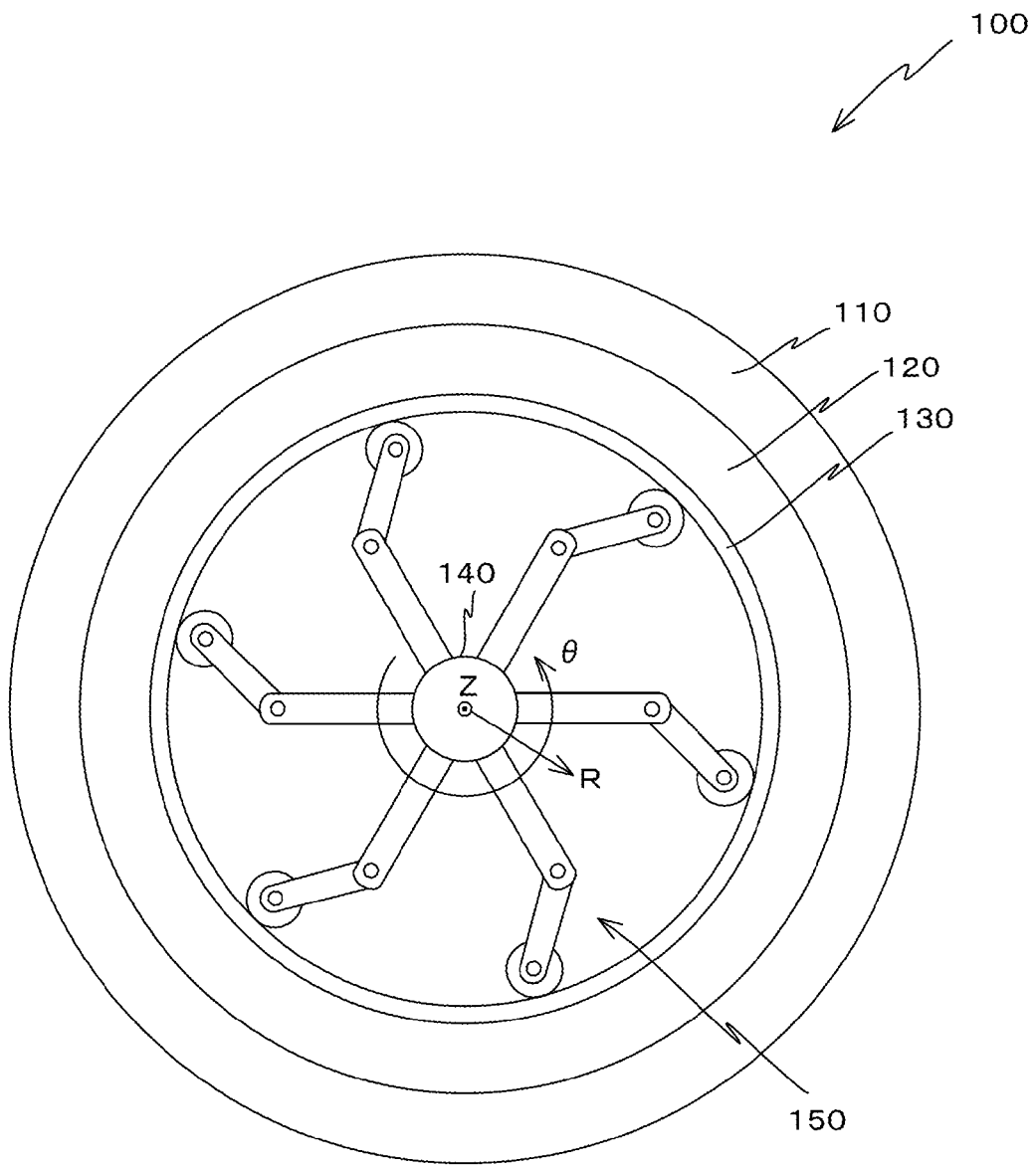
FIG. 2 is a plan view for explanation of the structure of the device of FIG. 1.

A figure showing the external appearance of a power generation device 100 according to an embodiment is shown in FIG. 1. Moreover, a plan view of this power generation device 100 is shown in FIG. 2. As shown overall in FIGS. 1 and 2, this power generation device 100 comprises a cylindrical outer frame member 110, a power generation part 120, and a pressure transmission member 130. Moreover, the power generation device 100 comprises a rotating shaft member 140 and a pressure member group 150.

It should be understood that, in the following explanation, it will be supposed that the positional relationships between the various elements are expressed by using a circular cylindrical coordinate system $(R, \theta, Z)$ that is defined by a Z axis that coincides with the central axis AZ of the cylindrical outer frame member 110, by the radius vector direction extending from this Z axis and orthogonal thereto (the R direction), and by the anticlockwise angular direction around the Z axis as a center axis (the $\theta$ direction).

As described above, the outer frame member 110 described above is built as a cylinder, with the AZ axis being its central axis. For example, a strengthened plastic material may be used as the material for this outer frame member 110, and the outer frame member may be made from this material by formation processing.

The power generation part 120 described above is shaped as a cylinder that has the same axis as the central axis of the outer frame member 110, in other words that has the AZ axis as its central axis, and that contacts against and is fixed to the inner wall of the outer frame member 110 (i.e., the surface of the outer frame member 110 in the opposite direction to the R direction (hereinafter termed the "–R direction")). By employing centrifugal force from the pressure member group 150 via a pressure transmission member 130, this power generation part 120 receives pressure. The structure of the power generation part 120 will be described hereinafter.

The pressure transmission member 130 described above is formed as a cylinder whose central axis is the AZ axis, and contacts against and is fixed to the inner wall of the power generation part 120 (i.e., the surface of the power generation part 120 in the –R direction). This pressure transmission member 130 is a flexible insulating sheet, and, for example, may be made by a formation process using a rubber member made from a material such as silicon rubber or the like. And, using a lubricating material, friction reduction processing is performed upon the surface of the pressure transmission member 130 that faces towards the central axis. This pressure transmission member 130 transmits pressure originating in centrifugal force from the pressure member group 150 to the power generation part 120.

The rotating shaft member 140 described above is a member made from, for example, steel, and has the shape of a cylindrical column whose rotational axis is coincidental with the central axis of the outer frame member 110, in other words that is coincidental with the AZ axis (hereinafter this will also sometimes be termed the central rotational axis AZ). And it is arranged for this rotating shaft member 140 to rotate along with a rotating member 900.

Here, the rotating member 900 rotates in the $\theta$ direction. It should be understood that, as the rotating member 900, it is possible to employ a member that rotates together with the axle of a wheel of a vehicle, or the like.

Figure 5:
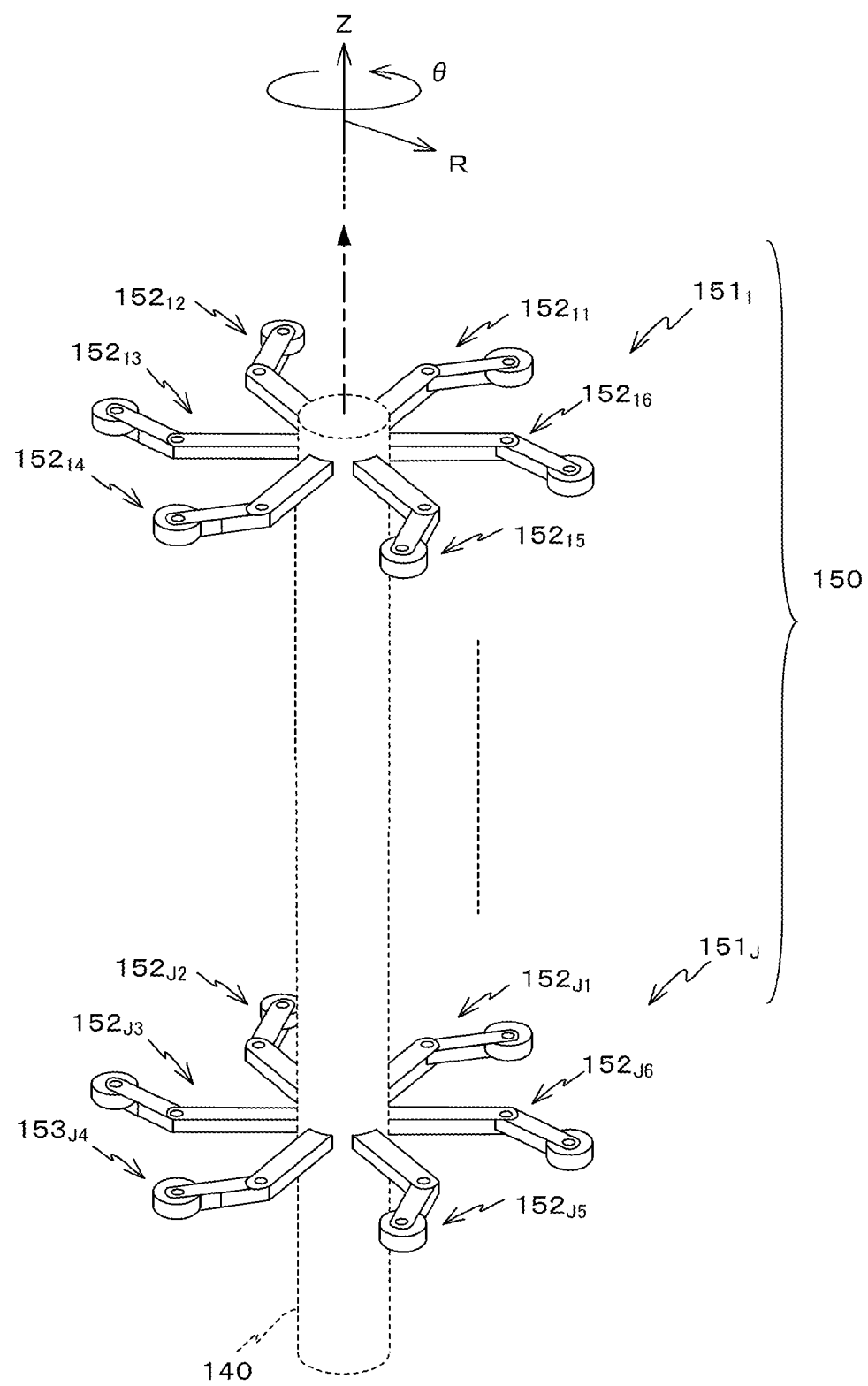
FIG. 5 is a figure for explanation of the way in which pressure members of FIGS. 1 and 2 are attached to a rotating shaft member.

The pressure member group 150 described above comprises a plurality of pressure members $152_{jk}$ (where j=1, ..., J and k=1, ..., 6) that are connected to the rotating shaft member 140 (refer to FIG. 5). The structure of this pressure member group 150 will be described hereinafter.

Figure 3:
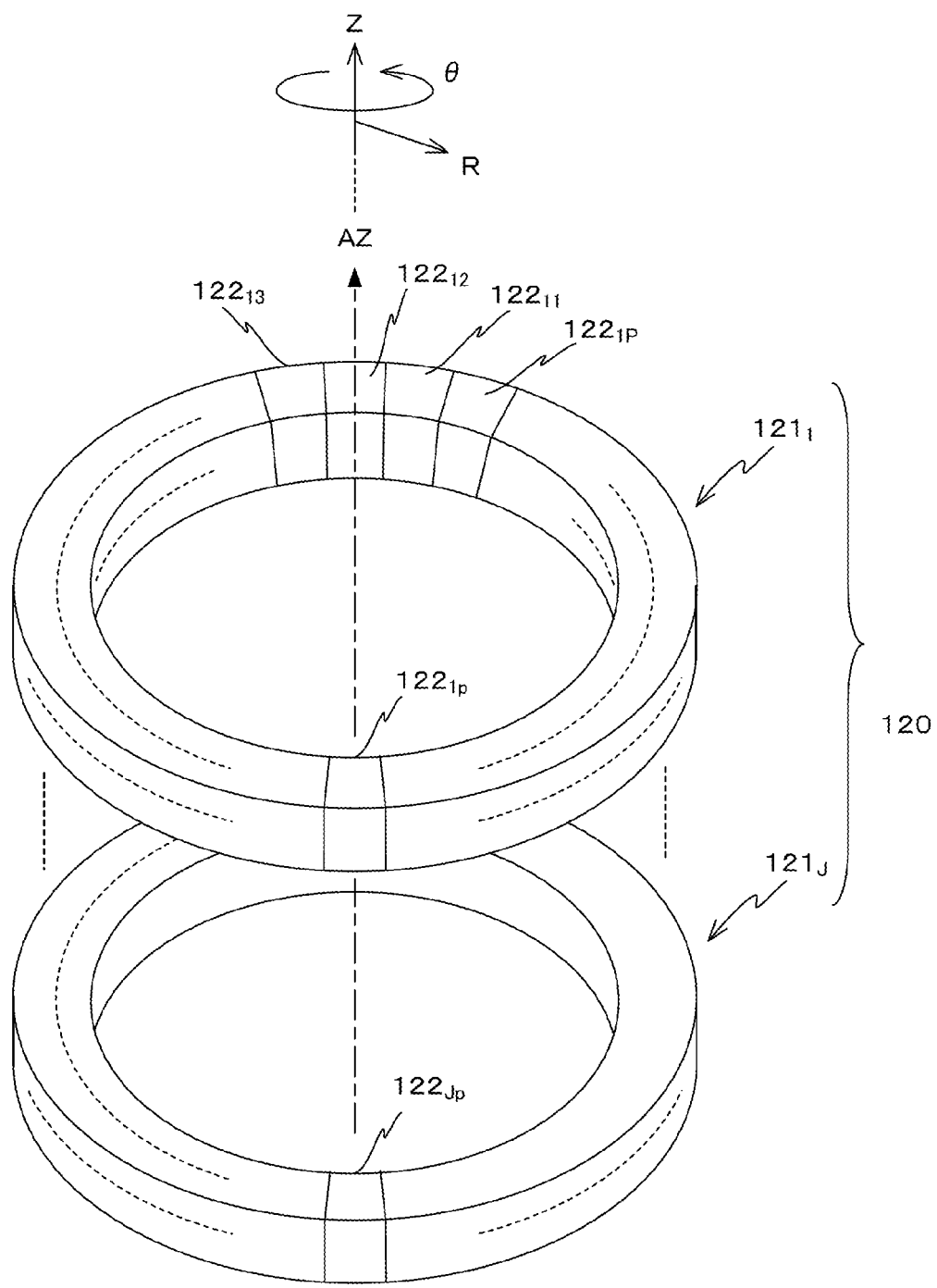
FIG. 3 is a figure for explanation of the structure of a power generation part of FIGS. 1 and 2.

Next, the structure of the power generation part 120 described above will be explained. As shown in FIG. 3, this power generation part 120 comprises a total of J annular power generation parts $121_j$ (where j=1, ..., J), arranged along the Z direction. And each of these annular power generation parts $121_j$ comprises a total of P individual power generation parts $122_{jp}$ (where p=1, ..., P), arranged around the $\theta$ direction.

It should be understood that it is arranged to dispose each of the individual power generation parts $122_{jp}$ at a Z position at which, via the pressure transmission member 130, it can receive pressure from a contact member 158 that will be described hereinafter of a pressure member $152_{jk}$.

Figure 4:
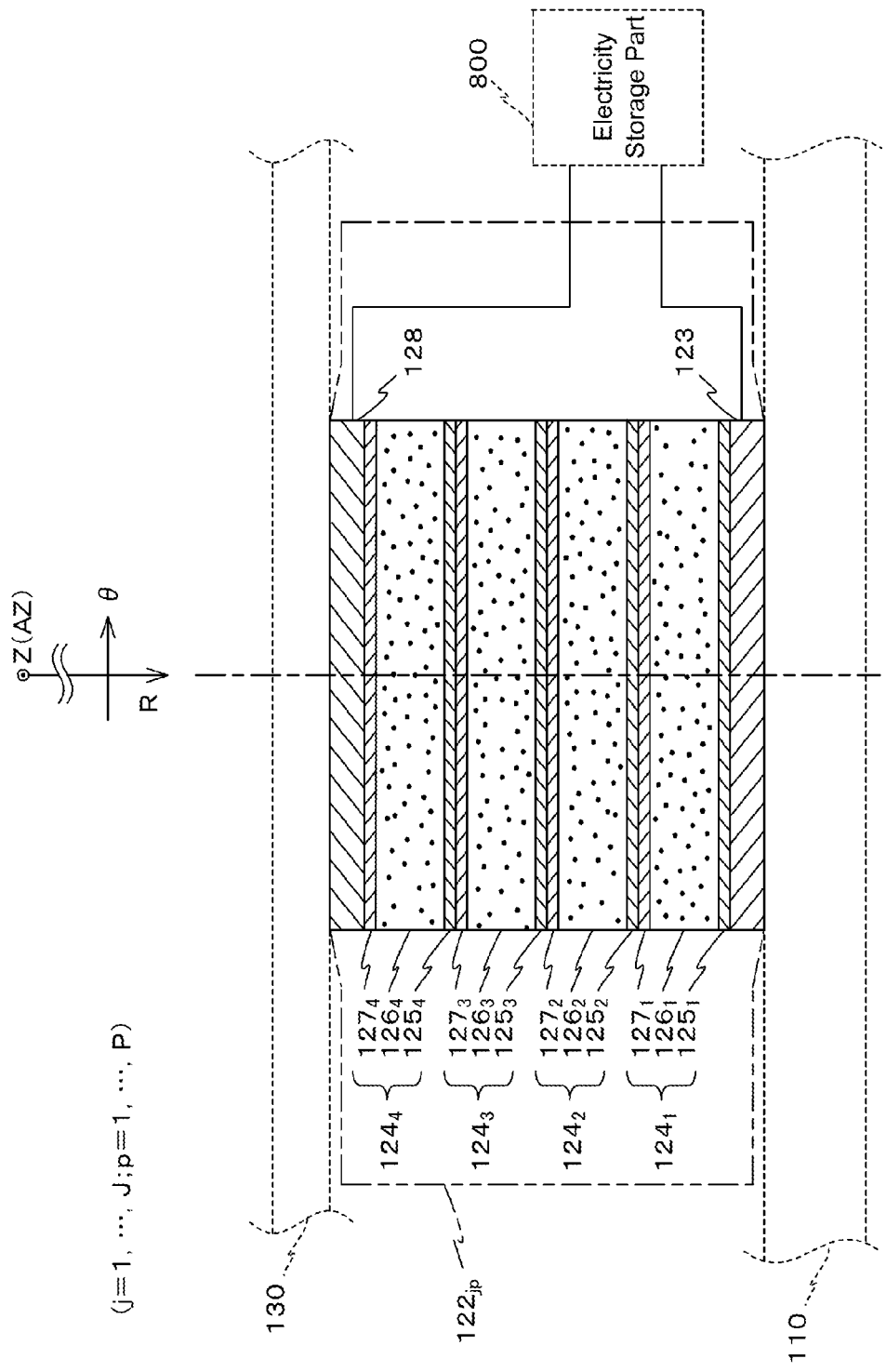
FIG. 4 is a sectional view for explanation of the structure of an individual power generation part of FIG. 3.

A sectional view of one of the individual power generation parts $122_{jp}$ in a plane that includes the Z axis is shown in FIG. 4. As shown in this FIG. 4, each of the individual power generation parts $122_{jp}$ comprises a terminal plate 123 that is formed as a sheet, four rectangular shaped piezoelectric elements $124_n$ (where n=1, ..., 4) in this embodiment, and a terminal plate 128, all laminated together in this order towards the Z axis (in other words, along the –R direction) upon the inner wall surface of the outer frame member 110 with the interposition of an insulating sheet not shown in the figure. And it is arranged for the surface in the –R direction of the terminal plate 128 to be contacted against and adhered to the surface of the pressure transmission member 130 in the R direction, with the interposition of an insulating sheet not shown in the figure.

Each of the piezoelectric elements $124_n$ described above generates a voltage when it receives pressure in the R direction via the pressure transmission member 130. And the voltages generated by each of the piezoelectric elements $124_n$ are transmitted to the exterior via the terminal plates 123 and 128. Each of these piezoelectric elements $124_n$ includes a piezoelectric body $126_n$, and, along with an electrode $125_n$ being formed upon the surface in the R direction of this piezoelectric body $126_n$, an electrode $127_n$ is formed upon the surface in the –R direction of the piezoelectric body $126_n$. The four laminated piezoelectric elements $124_1$ through $124_4$ are electrically connected together, since, in the mutual lamination of the piezoelectric elements $124_1$ through $124_4$ in this manner, the electrodes $127_1$ and $125_2$ are contacted together, the electrodes $127_2$ and $125_3$ are contacted together, and the electrodes $127_3$ and $125_4$ are contacted together.

The piezoelectric body 126 described above is made from a piezoelectric ceramic such as a lead zirconate titanate type ceramic or the like, or from a single piezoelectric crystal. Moreover, the electrodes $125_n$ and $127_n$ described above are made from a metal such as Al, Ni, Cu or the like, or from an alloy.

The terminal plates 123 and 128 described above are connected to an electricity storage part 800, which is an external device. And the voltage generated by the piezoelectric elements $124_1$ through $124_4$ is supplied from the terminal plates 123 and 128 to the electricity storage part 800. Here, a capacity for electricity storage or a storage battery or the like may be used as the electricity storage part 800.

Next, the structure of the pressure member group 150 will be explained. As shown in FIG. 5, this pressure member group 150 comprises pressure units $151_j$ (where j=1, ..., J) that are arranged at regular intervals along the Z axis direction. And each of these pressure units $151_j$ comprises, in this embodiment, six pressure members $152_{jk}$ (where k=1, . . . , 6) that are arranged around the circumference of the rotating shaft member 140 at regular intervals, and that are fixed to the rotating shaft member 140.

Figure 6:
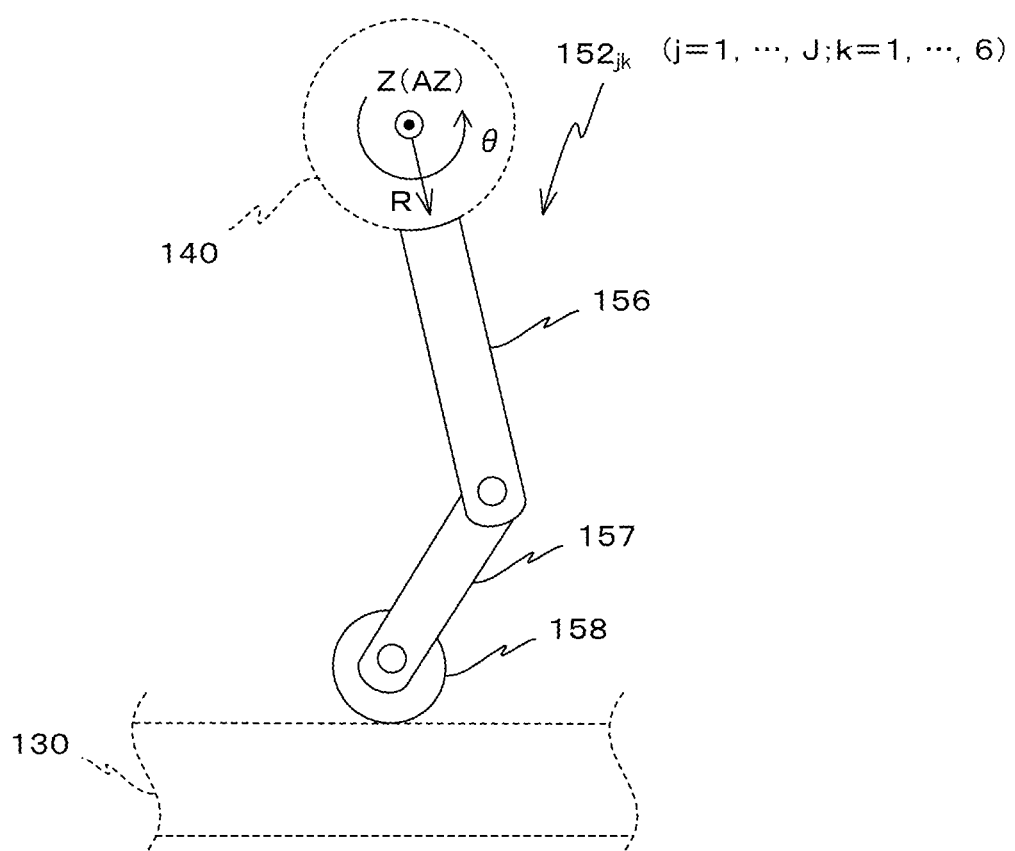
FIG. 6 is a figure for explanation of the structure of one of the pressure members of FIGS. 1 and 2.

As shown in FIG. 6, each of the pressure members $152_{jk}$ comprises a first bar shaped member 156, a second bar shaped member 157, and a contact member 158.

The first bar shaped member 156 described above is a member made from, for example, steel, and one of its end portions is fixed to the rotating shaft member 140, while its other end portion extends towards the pressure transmission member 130. A hole into which a shaft member for rotational movement is inserted is provided in the other end portion of the first bar shaped member 156, and the one end portion of the second bar shaped member 157 is connected thereto via the shaft member for rotational movement.

The second bar shaped member 157 described above is a member made from, for example, steel, and a hole is provided at the one end portion thereof into which the shaft member for rotational movement is inserted, and thereby, via the shaft member for rotational movement, the second bar shaped member 157 is connected to the other end portion of the first bar shaped member 156 so as to be rotatable around this shaft that is parallel to the central rotational axis AZ as a central rotational axis. Due to this, the shape into which the first bar shaped member 156 and the second bar shaped member 157 are connected becomes a letter-L shape when seen along the Z axis direction, and the second bar shaped member 157 becomes rotatable in the direction to approach the pressure transmission member 130 and in the opposite direction thereto. Moreover, a hole into which a shaft member for rotational movement is inserted is provided at the other end portion of the second bar shaped member 157, and the contact member 158 is connected thereto via this shaft member for rotational movement.

The contact member 158 described above is, in this embodiment, a member shaped as a circular cylinder whose central axis is a line parallel to the central rotational axis AZ. And a hole into which the shaft member for rotational movement is inserted is provided in the central portion of this circular cylindrical member, with the contact member 158 being thus connected to the other end portion of the second bar shaped member 157. By pressing against the pressure transmission member 130, it is arranged for this contact member 158 to exert pressure upon the piezoelectric elements $124_1$ through $124_4$ described above.

[Operation]

The operation of the power generation device 100 having a structure as described above will now be explained, with attention being principally directed to its operation for generating electrical power due to the pressure transmission member 130 being pressed by the pressure members $152_{jk}$ and exerting pressure upon the piezoelectric element.

First, when the rotating member 900 rotates in the θ direction, the rotating shaft member 140 that is fixedly attached to the rotating member 900 also rotates in the θ direction. When the rotating shaft member 140 rotates in this manner, centrifugal force acts upon the pressure members $152_{jk}$ (where j=1, . . . , J and k=1, . . . ,6) that are attached to that rotating shaft member 140.

Figure 7:
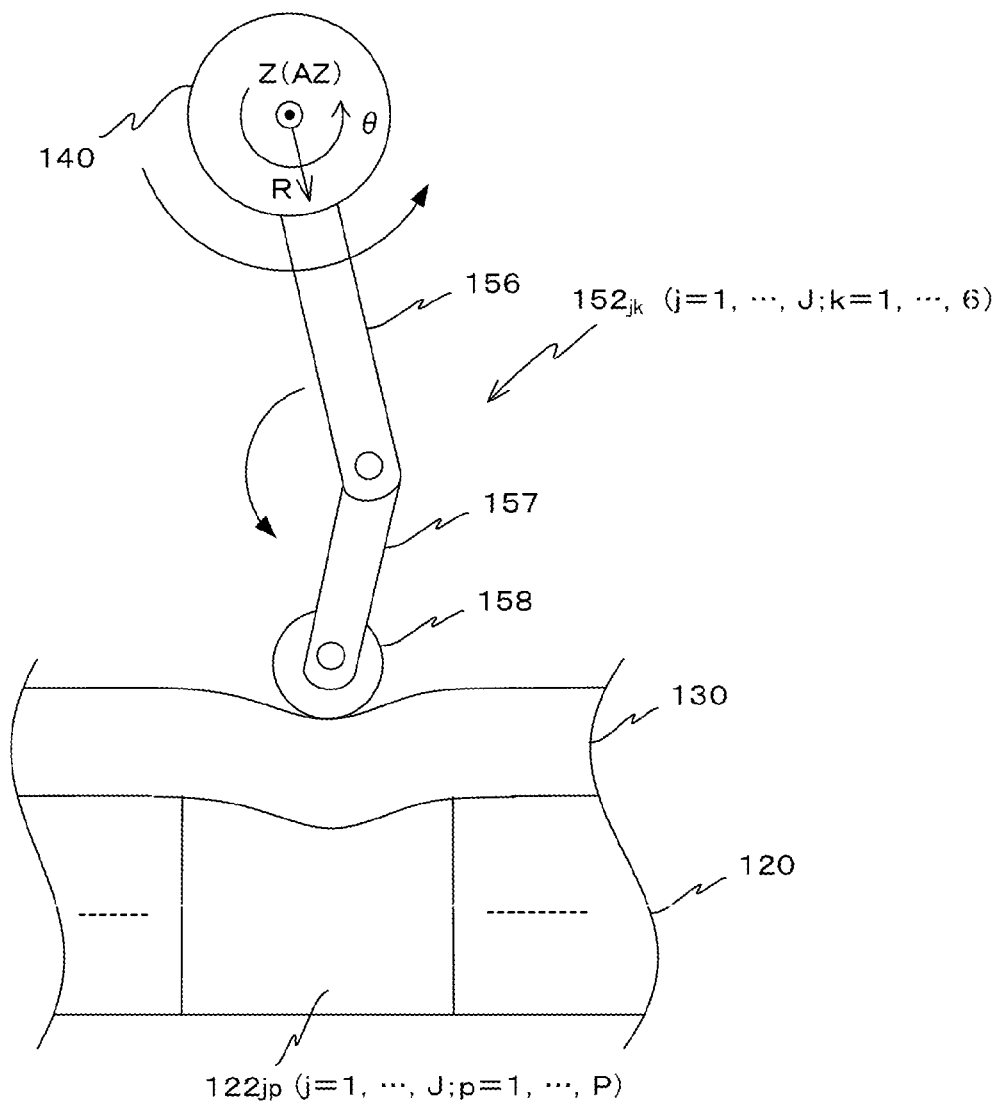
FIG. 7 is a figure for explanation of the way in which this pressure member presses upon a pressure transmission member.

When centrifugal force thus operates upon the pressure member $152_{jk}$, as shown in FIG. 7, the other end portion of the second bar shaped member 157 that is connected to the other end portion of the first bar shaped member 156 shifts in the direction towards the pressure transmission member 130. And the contact member 157 that is connected to the other end portion of the second bar shaped member 157 presses upon the pressure transmission member 130, upon which friction reduction processing has been performed.

When the pressure transmission member 130 is pressed in this manner by the contact member 158, the portion at which the pressure transmission member 130 is pressed flexes. And this pressure is transmitted to the power generation part 120 that is contacted against and adhered to the pressure transmission member 130 in the outward R direction at the position of flexure of the pressure transmission member 130. As a result, among the individual power generation parts $122_{jp}$ that constitute the power generation part 120, pressure acts upon that piezoelectric element $124_n$ that is disposed in the outward R direction at the position of flexure of the pressure transmission member 130. Since this pressure utilizes the centrifugal force that is generated due to the rotation of the rotating shaft member 140, accordingly, as the position of flexure of the pressure transmission member 130 continually changes along the direction of rotation, pressure acts cyclically and periodically upon the piezoelectric element $124_n$.

When this periodic pressure in the R direction acts upon the piezoelectric element $124_n$ in this manner, that piezoelectric element $124_n$ repeatedly and successively generates voltage. The voltages that are repeatedly and successively generated in this manner are supplied to the electricity storage part 800 via the terminal plates 123 and 128.

As has been explained above, in this embodiment, when the rotating shaft member 140 that is fixedly attached to the rotating member 900 rotates, centrifugal force acts upon the (6×J) pressure members $152_{jk}$ (where j=1, . . . , J and k=1, . . . , 6) that are fixed to that rotating shaft member 140. When centrifugal force thus acts upon the pressure members $152_{jk}$, the other end portions of the second bar shaped members 157 that are connected to the first bar shaped members 156 shift in the direction to approach the pressure transmission member 130, and the contact members 158 that are connected to these other end portions of the second bar shaped members 157 press upon the pressure transmission member 130, upon which friction reduction processing has been performed.

When the pressure transmission member 130 is pressed by the contact members 158 in this manner, these pressures act upon the power generation part 120 where it is contacted and adhered to the pressure transmission member 130 in the outward R direction at the positions of pressure. As a result, among the individual power generation parts $122_{jp}$ that constitute the power generation part 120, pressure is transmitted to those piezoelectric elements $124_n$ that are disposed in the outward R direction at the positions of pressure upon the pressure transmission member 130. When pressure in the R direction acts upon the piezoelectric elements $124_n$ in this manner, these piezoelectric elements $124_n$ continually and successively generate voltage.

Thus, according to this embodiment, with a simple construction, it is possible to implement power generation at high efficiency while utilizing a piezoelectric element.

MODIFICATION OF THE EMBODIMENT

The present invention is not to be considered as being limited to the embodiment described above; various alterations can be made thereto.

For example, in the embodiment described above, it was arranged for J pressure units to be provided, each consisting of six of the pressure members fixed to the rotating shaft member at regular intervals around the circumferential direction of the rotating shaft member, and for these to be fixed to the rotating shaft member at regular intervals along a direction parallel to the central axis of the rotating shaft member.

By contrast, it would also be acceptable to arrange for the number of pressure members that are fixed to the rotating shaft member around the circumferential direction of the rotating shaft member to be any number from one to five, or to be seven or more. Moreover, it would also be acceptable for the number of pressure members making up each of the pressure units that are fixed along a direction parallel to the central axis of the rotating shaft member to be different for each of the pressure units.

Furthermore while, in the embodiment described above, it was arranged to build each of the individual power generation parts to include four layers of piezoelectric elements, it would also be acceptable to arrange for the number of layers of piezoelectric elements making up each of the individual power sections to be from one to three, or to be five or more.

Moreover while, in the embodiment described above, the contact members that press upon the pressure transmission member were shaped as circular cylinders, it would also be acceptable, for example, for them to be spherical.

Furthermore while, in the embodiment described above, it was arranged to perform friction reduction processing with a lubricating material upon the surface of the pressure transmission member facing towards the central axis, as the method for this friction reduction processing, it would also be acceptable to arrange for the material used for this surface towards the central axis itself to be a lubricating material, or to arrange to apply a liquid lubricating material to this surface facing towards the central axis.

Moreover, in the embodiment described above, the pressure members were made to include the first and second bar shaped members, and it was arranged for the shapes in which the first bar shaped members and the second bar shaped members were connected to be letter-L shapes, when seen along the Z axis direction. By contrast, it would also be acceptable to employ some other shape for the pressure members, provided that it is one that allows centrifugal force originating in the rotation of the rotating shaft member to operate, and for the piezoelectric element to be pressed due to that centrifugal force.

The invention claimed is:

1. A power generation device, comprising:
   a plurality of piezoelectric elements that are arranged upon the inner wall surface of a cylindrical outer frame member;
   a rotating shaft member that rotates around the central axis of said outer frame member as a central rotational axis;
   a pressure transmission member provided over said plurality of piezoelectric elements and shaped as a cylinder having a central axis that is parallel to the central axis of said outer frame member; and
   a pressure member whose one end portion is fixed to said rotating shaft member and whose other end portion, along with shifting over said pressure transmission member along with the rotation of said rotating shaft member, also presses upon said pressure transmission member due to centrifugal force originating in said rotation, wherein
   said pressure member comprises:
      a first bar shaped member that includes said one end portion, and that extends towards said pressure transmission member;
      a second bar shaped member that is connected to the end portion of said first bar shaped member on said pressure transmission member side, so as to be shiftable in the direction to approach said pressure transmission member and in the opposite direction; and
      a contact member that is connected to the end portion of said second bar shaped member at the opposite side thereof to the side of said first bar shaped member, and that includes said other end portion.

2. A power generation device according to claim 1, wherein said second bar shaped member is connected to the end portion of said first bar shaped member on said pressure transmission member side, so as to be rotatable about a shaft that is parallel to said central axis as a central rotational axis.

3. A power generation device according to claim 1, wherein said contact member is connected to the end portion of said second bar shaped member at the opposite side thereof to the side of said first bar shaped member, so as to be rotatable about a shaft that is parallel to said central axis as a central rotational axis.

4. A power generation device according to claim 1, wherein said contact member is a member shaped as a circular cylinder, and has a shaft parallel to said central axis as a central axis.

5. A power generation device according to claim 1, wherein a plurality of said pressure members are fixed to said rotating shaft member along the circumferential direction of said rotating shaft member.

6. A power generation device according to claim 1, wherein a plurality of said pressure members are fixed to said rotating shaft member along a direction parallel to said central axis.

7. A power generation device according to claim 1, wherein that friction reduction processing with a lubricating material is performed upon the surface of said pressure transmission member on its side towards said central axis.

8. A power generation method employed by a power generation device that comprises a plurality of piezoelectric elements that are arranged upon the inner wall surface of a cylindrical outer frame member; a rotating shaft member that rotates around the central axis of said outer frame member as a rotational axis; a pressure transmission member provided over said plurality of piezoelectric elements and shaped as a cylinder having a central axis that is parallel to the central axis of said outer frame member; and a pressure member whose one end portion is fixed to said rotating shaft member and whose other end portion, along with shifting over said pressure transmission member along with the rotation of said rotating shaft member, also presses upon said pressure transmission member due to centrifugal force originating in said rotation, comprising:
   a rotation process of rotating said rotating shaft member; and
   a pressing process of, while due to the rotation of said rotating shaft member said other end portion of said pressure member is shifted over said pressure transmission member along its circumferential direction, employing centrifugal force generated due to said rotation to press upon said pressure transmission member with said other end portion of said pressure member, wherein
   said pressure member comprises:
      a first bar shaped member that includes said one end portion, and that extends towards said pressure transmission member;
      a second bar shaped member that is connected to the end portion of said first bar shaped member on said pressure transmission member side, so as to be shiftable in the direction to approach said pressure transmission member and in the opposite direction; and
      a contact member that is connected to the end portion of said second bar shaped member at the opposite side thereof to the side of said first bar shaped member, and that includes said other end portion.

* * * * *